(12) United States Patent
Hu et al.

(10) Patent No.: US 7,053,546 B2
(45) Date of Patent: May 30, 2006

(54) PLASTIC SUBSTRATE, FABRICATION METHOD THEREOF AND DEVICE USING THE SAME

(75) Inventors: Chen-Ze Hu, Jhonghe (TW); Chia-Tin Chung, Miaoli (TW); Ruey-Min Chen, Keelung (TW); Yao-Hui Lee, Kaohsiung (TW)

(73) Assignee: Chi Mei Optoelectronics Corporatio, Tainan (TW)

( * ) Notice: Subject to any disclaimer, the term of this patent is extended or adjusted under 35 U.S.C. 154(b) by 235 days.

(21) Appl. No.: 10/633,666

(22) Filed: Aug. 4, 2003

(65) Prior Publication Data
US 2004/0027060 A1   Feb. 12, 2004

(30) Foreign Application Priority Data
Aug. 6, 2002   (TW) .............................. 91117648 A

(51) Int. Cl.
*H01L 51/50* (2006.01)
*H05B 33/00* (2006.01)

(52) U.S. Cl. ...................... 313/504; 313/506; 428/446; 428/690

(58) Field of Classification Search ............... 313/504, 313/506, 509, 512; 428/690, 917, 446, 457, 428/469, 472
See application file for complete search history.

(56) References Cited

U.S. PATENT DOCUMENTS

| | | | | |
|---|---|---|---|---|
| 5,757,126 A * | 5/1998 | Harvey et al. | ............... | 313/506 |
| 5,792,550 A * | 8/1998 | Phillips et al. | ............... | 428/336 |
| 5,897,925 A * | 4/1999 | Huang et al. | ............... | 427/579 |
| 6,198,217 B1 * | 3/2001 | Suzuki et al. | ............... | 313/504 |
| 6,570,325 B1 * | 5/2003 | Graff et al. | ............... | 313/506 |
| 6,573,652 B1 * | 6/2003 | Graff et al. | ............... | 313/512 |

* cited by examiner

*Primary Examiner*—Karabi Guharay
(74) *Attorney, Agent, or Firm*—Thomas, Kayden, Horstemeyer & Risley

(57) ABSTRACT

A plastic substrate for OLED, fabrication method thereof and device using the substrate. The OLED comprises a plastic substrate with a deposition film of predetermined thickness formed thereon by plasma CVD. The deposition film has the formula $SiO_eC_aH_bX_cY_dZ_f$ ($e \leq 2$, $2-e=a+b+c+d+f$), wherein X, Y and Z are periodic table IA, IIA, IIIA, IVA, VA, VIA or VIIA elements excepting H. X, Y and Z also can be selected from the group consisting of Sc, Ti, V, Cr, Mn, Fe, Co, Ni, Cu, Zn, Pd, Ag, Pt and Au. The OLED with the plastic substrate has both glass and plastic properties, including high temperature tolerance, good gas and liquid resistance, superior planarity, and high transparency and high flexibility.

16 Claims, 2 Drawing Sheets

PLASTIC SUBSTRATE, FABRICATION METHOD THEREOF AND DEVICE USING THE SAME

BACKGROUND OF THE INVENTION

1. Field of the Invention

The present invention relates to organic electroluminescent devices (OLEDs), and more particularly to a plastic substrate for OLED, fabrication method thereof, and device using the substrate.

2. Description of the Related Art

OLEDs are known to be highly efficient and capable of producing a broad band width of colors, Due to thin profile and wide viewing angle, OLED applications are variable and can be used as flat-panel displays. In order to achieve flatness, transparency, and high fabrication temperature tolerance, glass is a common choice for substrates. Current trends move toward light weight, slim profile, and even display on non-flat surfaces. Therefore, soft and flexible displays are currently being developed to replace glass substrates.

In order to achieve the above objects, flexible plastic (polymer) substrates have been developed for OLED, such as polycarbonate (PC), polyethylene terephthalate (PET) and polyimide but these polymer substrates have some disadvantages.

Polymer temperature tolerance is too low for fabrication, with maximum PC temperature about 129° C. and PE about 120° C. As well, polymers exhibit poor resistance to ambient humidity and oxygen penetration. Finally, PC and PET plastic substrates have difficulty achieving optical flatness and cannot be polished by chemical mechanical polishing. Thus, in conventional technology, soft and flexible plastic substrate cannot replace glass. To address the problem of OLED luminescent materials being easily damaged by ambient humidity and air penetration, addition of an encapsulation layer is conventionally employed. As disclosed in U.S. Pat. No. 5,855,994, an encapsulation layer is formed by coating flowable silicon oxide on the anode, then using UV light to solidify the encapsulation layer or a roller to press the silicon oxide film onto the anode. However, the additional encapsulantion layer is both costly and time-consuming. Additionally, the disclosed encapsulant process fails to address the stated problems of temperature intolerance and insufficient planarity.

SUMMARY OF THE INVENTION

Thus, an object of the invention is to provide a plastic substrate for OLED, and method of fabrication thereof, meeting requirements of high processing temperature tolerance, resistance to ambient humidity and oxygen penetration, and good surface planarity, on a flexible surface with transparency required for OLED formation.

Another object of the present invention is to provide an OLED device using the inventive substrate.

Accordingly, the present invention provides a plastic substrate with a deposition film of predetermined thickness formed thereon. The deposition film is formed by plasma CVD with a formula of $SiO_eC_aH_bX_cY_dZ_f$ ($e \leq 2$, $2-e=a+b+c+d+f$), wherein X, Y and Z are periodic table IA, IIA, IIIA, IVA, VA, VIA or VIIA elements excepting H. X, Y and Z also can be selected from the group consisting of Sc, Ti, V, Cr, Mn, Fe, Co, Ni, Cu, Zn, Pd, Ag, Pt and Au. The OLED plastic substrate has both glass and plastic properties, allowing it to solve the above-mentioned problems. The glass properties provide high temperature tolerance, good gas and liquid resistance, superior planarity, and high transparency, whereas the plastic properties provide high flexibility. In addition, the deposition film has and encapsulated function, allowing OLED encapsulation fabrication to be omitted, such that the fabrication efficiency is improved.

The present invention also provides a method for fabrication of a plastic substrate for OLED, comprising providing a plastic substrate, and using plasma CVD to form a deposition film of predetermined thickness thereon, wherein the deposition film has a formula of $SiO_eC_aH_bX_cY_dZ_f$ ($e \leq 2$, $2-e=a+b+c+d+f$), wherein X, Y and Z are periodic table IA, IIA, IIIA, IVA, VA, VIA or VIIA elements excepting H. X, Y and Z also can be selected from the group consisting of Sc, Ti, V, Cr, Mn, Fe, Co, Ni, Cu, Zn, Pd, Ag, Pt and Au. By the above fabrication method, a plastic substrate for OLED featuring high temperature tolerance, good gas and liquid resistance, superior planarity, and high transparency and flexibility is obtained.

The present invention also provides an OLED using the plastic substrate, comprising a cathode and anode, with at least one organic layer therebetween, a first plastic substrate beneath the cathode, and a second plastic substrate of the inventive structure above the anode. When a voltage is applied on the cathode and anode, the organic layer emits light.

DESCRIPTION OF THE DRAWINGS

For a better understanding of the present invention, reference is made to a detailed description to be read in conjunction with the accompanying drawings, in which.

REFERENCE NUMERALS IN THE DRAWINGS

Figure 1A:
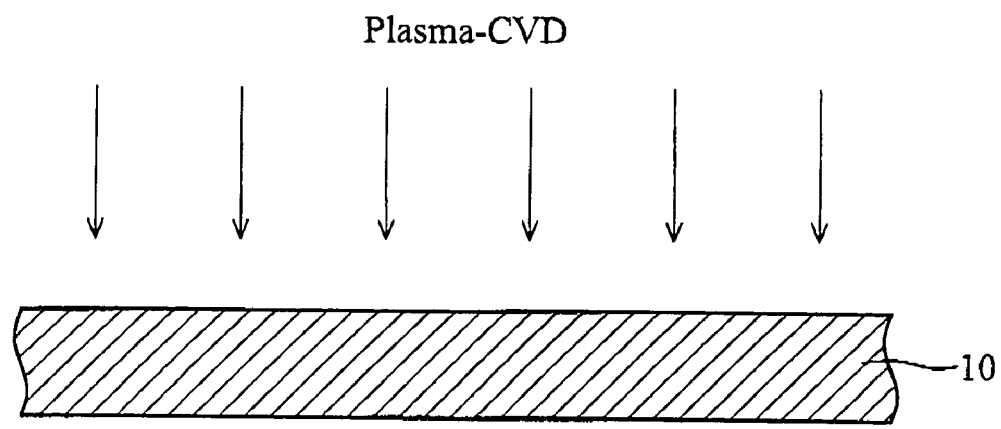
FIG. 1a and FIG. 1b show a fabrication process of the plastic substrate for OLED according to the first embodiment of the present invention.

10 plastic substrate
20 deposition film layer
30 plastic substrate for OLED & second plastic substrate
40 anode
50 hole transport layer
60 electroluminescent layer
70 electron transport layer
80 cathode
90 first plastic substrate
100 organic layer

DETAILED DESCRIPTION OF THE INVENTION

In order to understand the above and other objects, characteristics and advantages, two preferred embodiments of the present invention are now detailed described with reference to the attached figures.

Figure 1B:
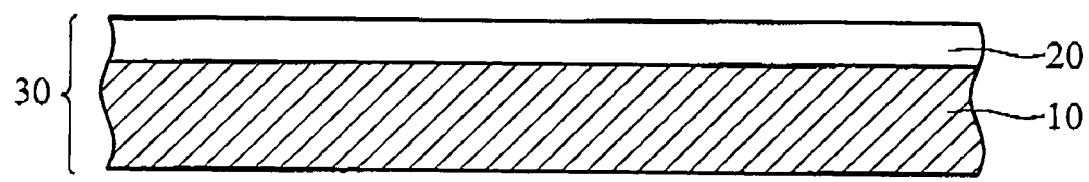

FIG. 1(a) and FIG. 1(b) show a fabrication process of an OLED plastic substrate comprising providing a plastic substrate 10 and using plasma CVD to form a deposition film layer 20 of a predetermined thickness thereon. The plastic substrate 10 and the deposition film layer 20 constitute a plastic substrate for OLED.

The plastic substrate 10 is formed with polycarbonate (PC), polyethylene terephthalate (PET), polyimide, polyester, or combinations thereof, although the present invention is not limited thereto. The deposition film layer 20 has a SiOeCaHbXcYdZf ($e \leq 2$, $2-e=a+b+c+d+f$) formula, wherein X, Y and Z are other than O, C is hydrogen, and X, Y and Z are periodic table IA, IIA, IIA, IVA, VA, VIA or VIIA elements excepting H. X, Y and Z also can be selected from the group consisting of Sc, Ti, V, Cr, Mn, Fe, Co, Ni, Cu, Zn, Pd, Ag, Pt and Au. The deposition film layer 20 is hereinafter referred to as PolySOX layer.

Because the deposition film layer 20 is formed by plasma CVD, free radicals in plasma produce 20~30 Å interface covalent bonds between the deposition film layer 20 and the plastic substrate 10, so that the two layers bond tightly.

The planar deposition layer thickness is in a range of about 0.1~4.5 µm. If the thickness is less than 0.1 µm, the deposition film layer 20 cannot block ambient humidity, oxygen, or other gas, and cannot accept CMP for full planarization, also, if the thickness exceeds 4.5 µm, the layer cracks easily.

In addition, the PolySOX layer has Si—O—Si bonds that provide more freedom than rigid Si—Si bonds due to the oxygen presence. Therefore, the PolySOX layer provides not only rigidity of Si—Si bonds, but also the flexibility and high temperature tolerance of Si. Furthermore, Si—O—Si bonds provide transparency of 97% or more.

Figure 2:
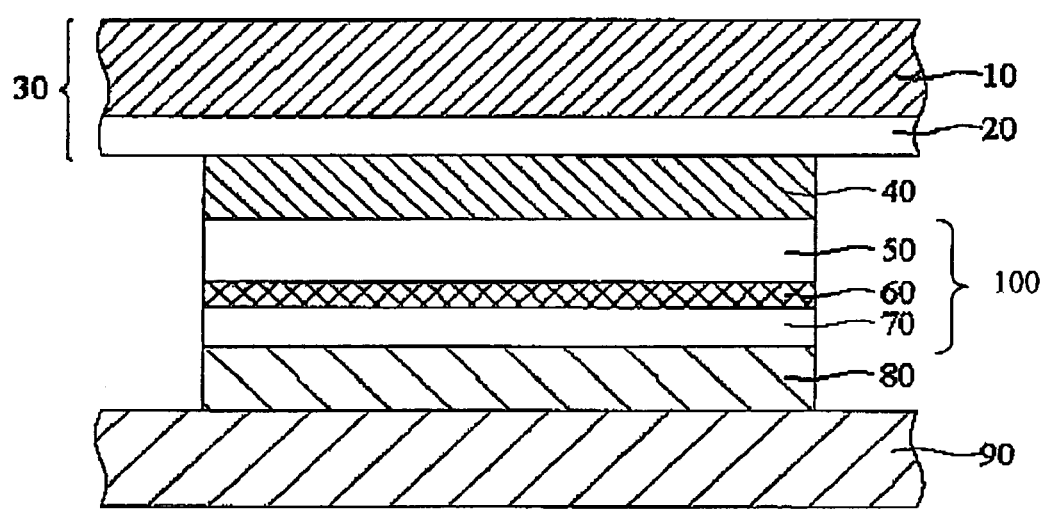
FIG. 2 is a cross-section of the OLED structure according to the second embodiment of the present invention.

An OLED using the plastic substrate of the present invention is also disclosed, with reference to FIG. 2.

In FIG. 2, the OLED using the first embodiment plastic substrate comprises a first plastic substrate 90, an anode 40, a hole transport layer 50, an electroluminescent layer 60, an electron transport layer 70, a cathode 80 and a second plastic substrate 30 comprising the inventive structure.

The hole transport layer 50, electroluminescent layer 60 and electron transport layer 70 constitute organic layer 100. The electron transport layer 70 is near the cathode and the hole transport layer 50 is near the anode. The electroluminescent layer 60 is between the hole transport layer 50 and the electron transport layer 70.

Thus, the invention provides a plastic substrate structure for OLED that overcomes the limitations and problems of the existing technology, meeting requirements of high processing temperature tolerance, resistance to ambient humidity and oxygen penetration, and good surface planarity, on a flexible surface with transparency required for OLED formation.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An organic electroluminescent device, comprising:
   a cathode;
   an anode;
   at least an organic layer between the anode and the cathode, such that when a voltage is applied to the cathode and the anode, the organic layer electroluminesces;
   a first substrate beneath the cathode; and
   a second plastic substrate above the anode, comprising:
      a plastic substrate; and
      a deposition film with a predetermined thickness formed on the plastic substrate by plasma chemical vapor deposition, the film having a formula of $SiO_e C_a H_b X_c Y_d Z_f$, wherein both $e \leq 2$ and $2-e=a+b+c+d+f$ are satisfied, wherein X, Y and Z are selected from the group consisting of Sc, Ti, V, Cr, Mn, Fe, Co, Ni, Cu, Zn, Pd, Ag, Pt, Au and the elements in periodic table IA, IIA, IIIA, IVA, VA, VIA and VIIA excepting H, the deposition film having transparency of at least 97%.

2. A plastic substrate for organic electroluminescent devices comprising:
   a plastic substrate;
   a deposition film with a predetermined thickness formed on the plastic substrate by plasma chemical vapor deposition, the film having a formula of $SiO_e C_a H_b X_c Y_d Z_f$, wherein both $e \leq 2$ and $2-e=a+b+c+d+f$ are satisfied, wherein X, Y and Z are selected from the group consisting of Sc, Ti, V, Cr, Mn, Fe, Co, Ni, Cu, Zn, Pd, Ag, Pt, Au and the elements in periodic table IA, IIA, IIIA, IVA, VA, VIA and VIIA excepting H, the deposition film having transparency of at least 97%; and
   a plurality of interface covalent bonds disposed between the deposition film layer and the plastic substrate.

3. The plastic substrate for organic electroluminescent devices as claimed in claim 2, wherein the predetermined thickness is 0.1 to 4.5 µm.

4. The plastic substrate for organic electroluminescent devices as claimed in claim 2, wherein a thickness of the interface covalent bonds is 20 to 30 Å.

5. A fabrication method for the plastic substrate for organic electroluminescent devices, comprising the steps of:
   providing a plastic substrate; and
   performing plasma chemical vapor deposition to form a deposition film of predetermined thickness on the plastic substrate, the film having a formula of $SiO_e C_a H_b X_c Y_d Z_f$, wherein both $e \leq 2$ and $2-e=a+b+c+d+f$ are satisfied, wherein X, Y and Z are selected from the group consisting of Sc, Ti, V, Cr, Mn, Fe, Co, Ni, Cu, Zn, Pd, Ag, Pt, Au and the elements in periodic table IA, IIA, IIIA, IVA, VA, VIA and VIIA excepting H, the deposition film having transparency of at least 97%, wherein a plurality of free radicals in the plasma produce an interface covalent bonds between the deposition film layer and the plastic substrate.

6. The fabrication method for the plastic substrate for organic electroluminescent devices as claimed in claim 5, wherein the predetermined thickness is 0.1 to 4.5 µm.

7. The fabrication method for the plastic substrate for organic electroluminescent devices as claimed in claim 5, wherein a thickness of the interface covalent bonds is 20 to 30 Å.

8. An organic electroluminescent device, comprising:
   a first electrode;
   a second electrode;
   at least an electroluminescent layer between the first electrode and the second electrode, such that when a voltage is applied to the first electrode and the second electrode, the electroluminescent layer electroluminesces;
   a first substrate beneath the first electrode; and
   a second plastic substrate above the second electrode, comprising:
      a plastic substrate; and
      a deposition film with a predetermined thickness formed on the plastic substrate by plasma chemical vapor deposition, the film having a formula of $SiO_e C_a H_b X_c Y_d Z_f$, wherein both $e \leq 2$ and $2-e=a+b+c+d+f$ are satisfied, wherein X, Y and Z are selected from the group consisting of Sc, Ti, V, Cr, Mn, Fe, Co, Ni, Cu, Zn, Pd, Ag, Pt, Au and the elements in periodic table IA, IIA, IIIA, IVA, VA, VIA and VIIA excepting H, the deposition film having transparency of at least 97%.

9. An organic electroluminescent device, comprising:
a cathode;
an anode;
at least an organic layer between the anode and the cathode, such that when a voltage is applied to the cathode and the anode, the organic layer electroluminesces;
a first substrate beneath the cathode; and
a second plastic substrate above the anode, comprising:
  a plastic substrate; and
  a deposition film with a predetermined thickness formed on the plastic substrate by plasma chemical vapor deposition, the film having a formula of $SiO_e C_a H_b X_c Y_d Z_f$, wherein both $e \leq 2$ and $2-e=a+b+c+d+f$ are satisfied, wherein X, Y and Z are selected from the group consisting of Sc, Ti, V, Cr, Mn, Fe, Co, Ni, Cu, Zn, Pd, Ag, Pt, Au and the elements in periodic table IA, IIA, IIIA, IVA, VA, VIA and VIIA excepting H.

10. A plastic substrate for organic electroluminescent devices comprising:
a plastic substrate;
a deposition film with a predetermined thickness formed on the plastic substrate by plasma chemical vapor deposition, the film having a formula of $SiO_e C_a H_b X_c Y_d Z_f$, wherein both $e \leq 2$ and $2-e=a+b+c+d+f$ are satisfied, wherein X, Y and Z are selected from the group consisting of Sc, Ti, V, Cr, Mn, Fe, Co, Ni, Cu, Zn, Pd, Ag, Pt, Au and the elements in periodic table IA, IIA, IIIA, IVA, VA, VIA and VIIA excepting H, and
a plurality of interface covalent bonds disposed between the deposition film layer and the plastic substrate.

11. The plastic substrate for organic electroluminescent devices as claimed in claim 10, wherein the predetermined thickness is 0.1 to 4.5 μm.

12. The plastic substrate for organic electroluminescent devices as claimed in claim 10, wherein a thickness of the interface covalent bonds is 20 to 30 Å.

13. A fabrication method for the plastic substrate for organic electroluminescent devices, comprising The steps of:
providing a plastic substrate; and
performing plasma chemical vapor deposition to form a deposition film of predetermined thickness on the plastic substrate, the film having a formula of $SiO_e C_a H_b X_c Y_d Z_f$, wherein both $e \leq 2$ and $2-e=a+b+c+d+f$ are satisfied, wherein X, Y and Z are selected from the group consisting of Sc, Ti, V, Cr, Mn, Fe, Co, Ni, Cu, Zn, Pd, Ag, Pt, Au and the elements in periodic table IA, IIA, IIIA, IVA, VA, VIA and VIIA excepting H, wherein a plurality of free radicals in the plasma produce a plurality of interface covalent bonds between the deposition film layer and the plastic substrate.

14. The fabrication method for the plastic substrate for organic electroluminescent devices as claimed in claim 13, wherein the predetermined thickness is 0.1 to 4.5 μm.

15. The fabrication method for the plastic substrate for organic electroluminescent devices as claimed in claim 13, wherein a thickness of the interface covalent bonds is 20 to 30 Å.

16. An organic electroluminescent device, comprising:
a first electrode;
a second electrode;
at least an electroluminescent layer between the first electrode and the second electrode, such that when a voltage is applied to the first electrode and the second electrode, the electroluminescent layer electroluminesces;
a first substrate beneath the first electrode; and
a second plastic substrate above the second electrode, comprising:
  a plastic substrate; and
  a deposition film with a predetermined thickness formed on the plastic substrate by plasma chemical vapor deposition, the film having a formula of $SiO_e C_a H_b X_c Y_d Z_f$, wherein both $e \leq 2$ and $2-e=a+b+c+d+f$ are satisfied, wherein X, Y and Z are selected from the group consisting of Sc, Ti, V, Cr, Mn, Fe, Co, Ni, Cu, Zn, Pd, Ag, Pt, Au and the elements in periodic table IA, IIA, IIIA, IVA, VA, VIA and VIIA excepting H.

* * * * *

UNITED STATES PATENT AND TRADEMARK OFFICE
CERTIFICATE OF CORRECTION

PATENT NO.        : 7,053,546 B2                                          Page 1 of 1
APPLICATION NO.   : 10/633666
DATED             : May 30, 2006
INVENTOR(S)       : Hu et al.

It is certified that error appears in the above-identified patent and that said Letters Patent is hereby corrected as shown below:

Title Page:
Item 73, Assignee should read:

-- Chi Mei Optoelectronics Corporation, Tainan (TW)
   Kyocera Corporation, Kyoto (JP) --

Signed and Sealed this

Thirteenth Day of February, 2007

JON W. DUDAS
*Director of the United States Patent and Trademark Office*